US012746845B2

(12) United States Patent
Altaf et al.

(10) Patent No.: US 12,746,845 B2
(45) Date of Patent: Sep. 29, 2026

(54) METHOD FOR PREDICTING STATE-OF-POWER OF A MULTI-BATTERY ELECTRIC ENERGY STORAGE SYSTEM

(71) Applicant: VOLVO TRUCK CORPORATION, Gothenburg (SE)

(72) Inventors: Faisal Altaf, Västra Frölunda (SE); Weiji Han, Gothenburg (SE); Torsten Wik, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 661 days.

(21) Appl. No.: 18/002,154

(22) PCT Filed: Jun. 18, 2020

(86) PCT No.: PCT/EP2020/066920
§ 371 (c)(1),
(2) Date: Dec. 16, 2022

(87) PCT Pub. No.: WO2021/254620
PCT Pub. Date: Dec. 23, 2021

(65) Prior Publication Data
US 2023/0219458 A1 Jul. 13, 2023

(51) Int. Cl.
*B60L 58/12* (2019.01)
*B60L 58/18* (2019.01)
(Continued)

(52) U.S. Cl.
CPC ............... *B60L 58/12* (2019.02); *B60L 58/18* (2019.02); *G01R 31/367* (2019.01);
(Continued)

(58) Field of Classification Search
CPC ...... B60L 58/12; B60L 58/18; B60L 2260/50; B60L 2240/549; B60L 3/0046;
(Continued)

(56) References Cited

U.S. PATENT DOCUMENTS 7,321,220 B2 * 1/2008 Plett .................. G01R 31/3648 324/426
8,466,684 B2 * 6/2013 Melichar ............ G01R 31/3842 324/426
(Continued)

FOREIGN PATENT DOCUMENTS

CN 1883097 A 12/2006
CN 105277895 A * 1/2016 ............. G01R 31/36
(Continued)

OTHER PUBLICATIONS

Extended European Search Report dated Aug. 30, 2024 in corresponding European Patent Application No. 24177004.9, 12 pages.
(Continued)

*Primary Examiner* — M Baye Diao
(74) *Attorney, Agent, or Firm* — Jeffri A. Kaminski; Venable LLP

(57) ABSTRACT

A method for predicting a state-of-power, SoP, of an electric energy storage system, ESS, comprising at least two battery units electrically connected in parallel. The method includes obtaining operational data from the at least two battery units of the ESS during operation of the ESS; computing the state-of-power of the ESS based on the obtained operational data and by using an algorithm based on a system-level model of the ESS, wherein the system-level model of the ESS takes into account on one hand each one of the at least two battery units of the ESS, and on the other hand at least one electrical connection between the at least two battery units, and wherein the system-level model of the ESS further takes into account a dynamic parallel load distribution between the at least two battery units.

16 Claims, 3 Drawing Sheets

(51) Int. Cl.

| | |
|---|---|
| ***G01R 31/367*** | (2019.01) |
| ***G01R 31/385*** | (2019.01) |
| ***H02J 7/00*** | (2026.01) |
| ***H02J 7/80*** | (2026.01) |
| ***H02J 7/90*** | (2026.01) |
| ***H02J 105/37*** | (2026.01) |

(52) U.S. Cl.
CPC .............. *G01R 31/385* (2019.01); *H02J 7/80* (2026.01); *H02J 7/855* (2026.01); *H02J 7/933* (2026.01); *B60L 2260/50* (2013.01); *H02J 2105/37* (2026.01)

(58) Field of Classification Search
CPC . B60L 3/12; B60L 50/66; B60L 58/22; G01R 31/367; G01R 31/385; H02J 7/0047; H02J 7/0063; H02J 7/00712; H02J 2310/48; H02J 7/0014; H02J 7/0013; H02J 7/0029; H02J 15/00; Y02T 10/70; H01M 10/42; H01M 10/425; B60K 1/04
USPC .......................................................... 320/126
See application file for complete search history.

(56) References Cited

U.S. PATENT DOCUMENTS

| | | | | |
|---|---|---|---|---|
| 9,197,078 | B2 * | 11/2015 | Lee | B60L 58/14 |
| 9,878,632 | B2 * | 1/2018 | Zhou | B60L 50/90 |
| 12,365,266 | B2 * | 7/2025 | Altaf | B60L 3/12 |
| 2005/0110498 | A1 * | 5/2005 | Plett | G01R 31/3828 324/433 |
| 2009/0306915 | A1 * | 12/2009 | Schoch | G01R 31/367 324/427 |
| 2014/0372053 | A1 * | 12/2014 | Lin | B60L 58/16 702/63 |
| 2015/0171640 | A1 | 6/2015 | Lee | |
| 2020/0164763 | A1 | 5/2020 | Holme | |
| 2023/0041052 | A1 * | 2/2023 | Altaf | H01M 10/482 |
| 2023/0219458 | A1 * | 7/2023 | Altaf | B60L 58/12 320/126 |

FOREIGN PATENT DOCUMENTS

| | | | | |
|---|---|---|---|---|
| CN | 105301509 A | | 2/2016 | |
| CN | 108845273 A | | 11/2018 | |
| CN | 110196393 A | | 9/2019 | |
| CN | 110383094 A | | 10/2019 | |
| CN | 111038328 A | * | 4/2020 | B60L 58/10 |
| EP | 2987674 A1 | | 2/2016 | |
| EP | 3011655 B1 | | 5/2017 | |

OTHER PUBLICATIONS

International Search Report and Written Opinion in corresponding International Application No. PCT/EP2020/066920 mailed Mar. 9, 2021 (9 pages).
International Preliminary Report on Patentability in corresponding International Application No. PCT/EP2020/066920 mailed Oct. 6, 2022 (8 pages).
Carlos Artemio Coello Coello; "Constraint-Handling Techniques used with Evolutionary Algorithms"; GECCO Companion '15: Proceedings of the Companion Publication of the 2015 Annual Conference on Genetic and Evolutionary Computation; Jul. 2015; pp. 367-389; https://doi.org/10.1145/2739482.2756561; 23 pages.
Aloisio Kawakita de Souza et al; "Lithium-Ion Battery Charging Control Using a Coupled Electro-Thermal Model and Model Predictive Control"; Published in: 2020 IEEE Applied Power Electronics Conference and Exposition (APEC); Mar. 15-19, 2020; New Orleans, LA, USA; DOI: 10.1109/APEC39645.2020.9124431; 6 pages.
Chinese Office Action dated Aug. 6, 2023 in corresponding Chinese Patent Application No. 202080102125.9, 6 pages.
LV Jie et al: "Performance of LiFePO4 batteries in parallel based on connection topology", Applied Energy. Elsevier Science Publishers., GB, vol. 252, Jun. 22, 2019 (Jun. 22, 2019), XP085769340, ISSN: 0306-2619, DOI: 10.1016/J.APENERGY.2019.113407 [retrieved on Jun. 22, 2019].
Gong Xianzhi et al: "Study of the characteristics of battery packs in electric vehicles with parallel-connected lithium-ion battery cells", 2014 IEEE Applied Power Electronics Conference and Exposition—APEC 2014 IEEE, Mar. 16, 2014 (Mar. 16, 2014) pp. 3218-3224, XP032590746, DOI: 10.1109/APEC.2014.6803766 [retrieved on Apr. 21, 2014].
Limei Wang et al: "Influence of connecting plate resistance upon LiFePO4 battery performance", Applied Energy., vol. 147, Jun. 1, 2015 (Jun. 1, 2015) pp. 353-360, XP055314728, GB ISSN: 0306-2619, DOI: 10.1016/J.apenergy.2015.03.016.
European Communication pursuant to Article 94(3) EPC dated Aug. 3, 2026 in corresponding European Patent Application No. 24177004. 9, 7 pages.

* cited by examiner

METHOD FOR PREDICTING STATE-OF-POWER OF A MULTI-BATTERY ELECTRIC ENERGY STORAGE SYSTEM

CROSS-REFERENCE TO RELATED APPLICATIONS

This application is a U.S. National Stage application of PCT/EP2020/066920, filed Jun. 18, 2020 and published on Dec. 23, 2021, as WO 2021/254620, all of which is hereby incorporated by reference in its entirety.

TECHNICAL FIELD

The invention relates to a method for predicting a state-of-power of an electric energy storage system, ESS, comprising at least two battery units electrically connected in parallel. The invention further relates to a method for controlling loading of an electric energy storage system, a control unit of an electric energy storage system, a computer program, a computer readable medium, an electric energy storage system, and a vehicle.

The invention may be applied in any electric energy storage system that comprises at least two battery units connected in parallel, wherein the parallel connection or connections may be present at any level within the ESS. Such an ESS is also commonly referred to as a multi-battery ESS. In particular, the invention can be applied in electrically operated heavy-duty vehicles, such as trucks, buses and construction equipment. Although the invention will be described with respect to a fully electrified bus, the invention is not restricted to this particular vehicle, but may also be used in other vehicles such as buses, trailers, wheel loaders, excavators, passenger cars, etc. It is applicable in fully electrically operated vehicles as well as in hybrid vehicles, comprising also a combustion engine.

The invention may also be applied in electric systems of e.g. electrically propelled and operated vessels and in various working machines. It may further be applied in stationary electric energy storage systems, such as in smart grid or back-up power supply systems.

BACKGROUND

Electric energy storage systems are frequently used in a wide variety of applications and fields of technology. In the automotive industry, energy storage systems may be used for propulsion of a vehicle as well as for providing electrical energy to various systems of a vehicle.

In order to increase the power capability of an electric energy storage system, hereinafter also referred to as an ESS, a solution can be provided where two or more battery modules/battery packs of the ESS are electrically connected in parallel to each other, i.e. a multi-battery ESS. Depending on the configuration of the ESS, this enables easy connection and disconnection of parallel-connected individual battery modules to or from each other, although the ESS may comprise both breakable and fixed parallel connections between battery units. Also, an increased total power capability as well as increased energy capacity is provided in comparison to using only a single battery module/battery pack.

However, a problem with electric energy storage systems having battery modules connected in parallel is that the battery modules need to be in approximately the same physical state for optimal power and energy usage, i.e. for maximising utilisation of the total available power from the ESS. The term "physical state" is herein to be understood as including state-of-charge (SoC), state-of-health (SoH), state-of-resistance (SoR), state-of-temperature (SoT), etc. It is however a common scenario that the battery modules/battery packs are not in the same physical state. For example, if the parallel-connected battery modules are differently aged, i.e. one of the battery modules has been recently replaced by a new and unused battery module, there will most likely be a difference in power capability between the differently aged battery modules. The older and weaker battery module will have a complicated dynamic interaction with the new and more powerful battery module and may thus pull down the total available power of this joint system as compared to their individual sum. In short, the maximum available power of the ESS will be limited by the weakest link in the system, e.g. the oldest battery module. Also, care should be taken when mixing battery cells/modules/packs of different generation/types in a same ESS, since their impedance and open circuit voltage (OCV) characteristics are significantly different from each other. Another example is that if one of the battery modules has a higher temperature than the other battery modules, the resistance of the battery module having an elevated temperature will most likely be lower than the resistance of the battery modules having lower temperature. In such a situation, there is a risk that the warmer battery module will receive a charge current exceeding its threshold.

Another problem with multi-battery energy storage systems having parallel-connected battery modules is that different battery packs may be placed in different locations of the vehicle, and may thus require high-voltage cables of different lengths, thereby introducing large differences in resistances.

The amount of load current or power that can be continuously applied to an ESS during charging or discharging is determined by the state-of-power, SoP, of the ESS. Thus, in order to control which load to apply to the ESS, it is necessary to somehow predict the SoP of the ESS. The most common method in both industrial practice and academic research to predict the SoP is to use a so-called bottom-up approach and first estimate the SoPs of individual battery cells within the ESS, and then infer the ESS's SoP from these individual cell SoPs. This method is referred to as the cell-SoP-based method.

This bottom-up approach is used in e.g. EP 3 011 655, in which the lowest maximum power capability of one of the battery packs is multiplied by the total number of battery packs in order to get the total power capability of the ESS. In EP 3 011 655, it is further attempted to improve the ESS SoP by using feedback about an actual maximum load on each battery pack, whenever the ESS is loaded at its SoP limit that was computed at a previous time step.

This control approach has the disadvantage of being quite conservative in terms of utilising the full potential service of the ESS, i.e. quality-of-service (QoS) (e.g. power delivery performance as per power demand while ensuring long lifetime) and state-of-utilisation (SoU) (e.g. ratio of actual power delivered and potential available power). Clearly, a too conservative estimate of the battery pack or ESS SoP indicates a waste of certain available power capability as well as the installed power capacity. On the other hand, a too aggressive SoP estimate could incur a series of progressive issues, such as high power loss, rapid temperature increase, premature termination of charging/discharging, accelerated degradation, and even circuit faults, thermal runaway, and fire hazards. Thus, it is crucially important to accurately predict the SoP of a single battery system and a multi-battery ESS. Moreover, only based on precise SoP prediction can a controller effectively regulate the charging and/or discharging current or power for optimized performance of the multi-battery ESS.

There is hence a need for improved controlling of charge and discharge capability for electric energy storage systems having battery units connected in parallel.

Definitions

The wording "electric energy storage system", ESS, should in the following and throughout the entire description be interpreted to include a battery system including at least two battery units connected in parallel, wherein "battery unit" is further defined in the following. The ESS may comprise a plurality of battery units and parallel connections may be present at any level within the ESS.

The wording "battery unit" should in the following and throughout the entire description be interpreted to include a battery pack, which itself may comprise one or more battery modules electrically connected in parallel or in series. Still further, the wording "battery unit" should be understood to also include a unit which may comprise a plurality of battery packs. The wording "battery unit" should also be understood to include a single battery cell, a string of series-connected battery cells, and a battery module comprising a plurality of parallel-connected and/or series-connected battery cells. Accordingly, the wording "battery unit" may refer to a battery cell, a battery module comprising at least one battery cell, a battery pack comprising at least two battery modules, as well as a unit comprising at least two battery packs.

The wording "load current and/or load power" should herein be understood as to include one or both of load current and load power, wherein load current is one or both of charging current and discharging current, and wherein load power is one or both of charging power and discharging power. This may also be referred to as "charging and/or discharging current or power".

By the term "prediction time horizon" is meant a time period from a given instant to a time point in the future.

As used in the context of the present application, the state-of-power, SoP, of an electric energy storage system, ESS, is defined by the maximum constant current magnitude or power magnitude with which the ESS can be continuously charged or discharged during the following time horizon of concern, i.e., the prediction time horizon, without violating any battery cell-level operating constraints. The SoP of the ESS during charging is defined by the maximum constant current magnitude or power magnitude with which the ESS can be continuously charged during the prediction time horizon, without violating any battery cell-level operating constraints. Correspondingly, the SoP of the ESS during discharging is defined by the maximum constant current magnitude or power magnitude with which the ESS can be continuously discharged during the prediction time horizon, without violating any battery cell-level operating constraints. The SoP of the ESS may be determined in terms of one or both of current magnitude and power magnitude. The SoP of the ESS may be determined in parallel for a charging and a discharging scenario and may in this case comprise a current and/or a power value valid for charging, and a current and/or a power value valid for discharging. The SoP of the ESS may also be predicted for only one of a charging and a discharging scenario.

SUMMARY

A primary objective of the invention is to provide an in at least some aspect improved method for predicting the state-of-power, SoP, of an electric energy storage system, ESS, having battery units electrically connected in parallel. In particular, it is an objective to provide an accurate prediction/estimate of the SoP based on which charging and discharging of such an ESS may be controlled.

According to a first aspect of the invention, at least the primary objective is achieved by a method for predicting a state-of-power of an ESS comprising at least two battery units electrically connected in parallel according to claim 1. The method, which is computer implemented, comprises:

- obtaining operational data from the at least two battery units of the ESS during operation of the ESS,
- computing the state-of-power of the ESS based on the obtained operational data and by using an algorithm based on a system-level model of the ESS, wherein the system-level model of the ESS takes into account on one hand each one of the at least two battery units of the ESS, and on the other hand at least one electrical connection between the at least two battery units, and wherein the system-level model of the ESS further takes into account a dynamic parallel load distribution between the at least two battery units.

Thus, according to the method, the SoP of the entire ESS is predicted without any intermediate estimation or prediction of a state-of-power, SoP(i), of the individual battery units of the ESS. The method uses operational data from the at least two battery units as input in the system-level model of the ESS. The SoP of the ESS is thus computed using the system-level model, with the operational data from the individual battery units as input data. This corresponds to a top-down approach in which the SoP of the ESS is directly computed using multi-battery model based predictions, i.e. the system-level model based predictions, in contrast to a bottom-up approach in which SoP(i) of individual battery units are first computed and thereafter the ESS SoP. The use of a system-level model thus enables a direct prediction of the SoP of the entire ESS. A more accurate prediction of the SoP may be achieved as the prediction does not rely on predicted SoP(i) of individual battery units, such as individual battery cells or battery packs.

The top-down approach used according to the present invention implies that the load current, and/or the load power, of the entire ESS is/are set to be constant over a prediction time horizon, while the load current and/or load power of the individual battery units is/are allowed to vary as long as individual battery unit operating constraints are not violated. In contrast, a bottom-up approach, as commonly used, implies that the load current and/or load power of the individual battery units is set to be constant over the prediction time horizon. From an overall ESS utilisation perspective, the top-down approach is useful since an end user function, such as a vehicle control system, does not require information relating to whether the load power/load current of individual battery units vary or not, as long as they are within the individual battery unit operating constraints.

A method for predicting the SoP of a multi-battery ESS comprising parallel-connected battery units is thereby achieved, which method is more accurate and provides a predicted SoP estimate that can be used as a basis to effectively regulate the charging or discharging current or power for optimized performance of the ESS. By taking the electrical connections between the parallel-connected battery units into account, and not only the individual battery units, it is possible to overcome difficulties associated with controlling an ESS-level load current or power to/from a system in which the load distribution, i.e. the current and/or power distribution, among battery units changes over time as a result of changing resistance, for example due to temperature variations etc. Cable connection resistances may be specified individually for each cable connection. Electro-thermal simulations of a mixed generation multi-battery system, predictions of current split between parallel-connected battery units, temperature predictions under coolant flow, and in-rush current prediction under connect on the fly may be taken into account in a state-space representation within the system-level model. The dynamic parallel load distribution between the at least two battery units is taken into account so as to model a dynamic interaction between the parallel-connected battery units. The system-level model is thus capable of making dynamic predictions of load distribution between the battery units.

Preferably, the system-level model may take into account the dynamic parallel load distribution between the battery units at least at two separate future time instants.

The state-of-power for charging of the ESS may be different from the state-of-power for discharging of the ESS. The method may in parallel predict the state-of-power for both charging and discharging, i.e. the charging current and/or power, and the discharging current and/or power, respectively. An output from the method may thus comprise one signal representing a charging SoP and/or one signal representing a discharging SoP. As also discussed above, the SoP may be provided in terms of current and/or power.

Parallel connections may be present at any level within the ESS, i.e. between individual battery cells, and/or between individual battery modules in turn comprising series connected battery cells, and/or between individual battery packs of the ESS. The model may preferably take into account at least all existing parallel electrical connections between the at least two battery units. Also electrical connections within the battery units, such as between series-connected battery cells, are preferably taken into account.

If the ESS comprises parallel-connected battery units, which in turn comprise a plurality of parallel-connected sub-units, e.g. if the ESS comprises two parallel-connected battery modules that in turn comprise parallel-connected battery cells, the parallel-connected sub-unit within each battery unit may be treated as one large battery unit with constrained variables defined as an aggregate for the entire battery unit, and not for individual sub-units within that battery unit. Alternatively, each battery unit comprising parallel-connected sub-units may itself be treated as a "multi-battery ESS", and in that case the proposed method to compute the ESS SoP is applicable to the battery unit.

The operational data from the individual battery units, used as input data to the system-level model, may comprise measurement data relating to current, voltage, and temperature of each battery unit, obtained using sensors. The operational data may further comprise calculated/estimated data relating to state-of-charge (SoC), state-of-capacity (SoQ), state-of-health (SoH), state-of-resistance (SoR), and state-of-temperature (SoT) etc., of each battery unit. Such calculated/estimated data relating to SoC, SoH, SoQ, SoR, etc., may be inferred from the measurement data using different types of linear/nonlinear estimation/observation methods including Kalman Filtering, Recursive Least Squares, etc. The battery unit SoH is a quantity that indicates the battery unit's health relative to its initial health at a beginning of its life. It may be computed based on SoQ and SoR estimates.

The system-level model of the ESS may take into account a plurality of variables of each one of the at least two battery units. The variables may at least in part correspond to the operational data used as input data to the model. The system-level model may for example take into account the following:

- a number of battery units,
- a state-of-charge, SoC(i), of each battery unit i,
- a temperature, T(i), of each battery unit i,
- a state-of-capacity, SoQ(i), of each battery unit i,
- a state-of-resistance, SoR(i), of each battery unit i,
- a connection resistance between the battery units, and between battery units and a load used for charging/discharging of the ESS. Cable connection resistance may be estimated online during the prediction of the SoP, or it may be pre-calculated based on given resistivity properties of the cable material and dimensions, including length and cross-sectional area.

The model may thus be tailored depending on the number of battery units, and the ageing level and battery type of each battery unit is accounted for, wherein the ageing level refers to the SoQ, SoR, and/or the SoH of each battery unit. A more accurate SoP estimate may thus be achieved for a heterogeneous or mixed-generation multi-battery system.

Optionally, the system-level model of the ESS is a dynamic mathematical model based on an equivalent circuit model in which the at least one electrical connection between the at least two battery units is modelled as at least one resistance. The equivalent circuit model may be zero-order, i.e., containing only one ohmic resistance and no RC element, $1^{st}$ order, i.e., one resistance and one RC element, $2^{nd}$ order, or $n^{th}$ order, i.e., one ohmic resistance and n RC elements. Alternatively, the system-level model of the ESS may be a dynamic mathematical model based on another model such as an electrochemical model, an empirical model, a semi-empirical model, or another known model, may be used.

Optionally, operating limits of at least one constrained variable of each one of the at least two battery units are used as input to the system-level model, wherein the at least one constrained variable includes at least one of battery unit current, battery unit terminal voltage, battery unit temperature, battery unit state-of-charge, and battery unit open circuit voltage. The proposed method allows inclusion of all constrained variables at the same time, thus operating limits of multiple constrained variables can be considered simultaneously. The operating limits may be upper and/or lower operating limits. Different operating limits may be set for charging and discharging. Operating limits for the battery unit current and the battery unit terminal voltage are typically set for current magnitude and voltage magnitude, respectively. Such operating limits may be set in dependence on battery type and may e.g. be defined by a manufacturer of the battery units.

By setting operating limits of constrained variables of each battery unit, it is possible to allow variations of the variables occurring at a battery unit level, such as at a battery cell level, during the prediction time horizon. In this way, it is possible to achieve the top-down approach referred to above, wherein the constraints at a battery unit level are set by the operating limits. In short, individual battery units are not required to keep a constant power level over an entire prediction time horizon. This contributes to a more accurate estimation of the SoP of the ESS comprising parallel-connected battery units, since the parallel connections lead to a current distribution between the battery units that changes over time.

The battery unit current magnitude should preferably be constrained by setting at least an upper operating limit, since too large current magnitude can cause multiple issues, such as high power loss and temperature, fast degradation, and even fire hazard. For modules comprising series connected cells, such as a plurality of battery cells connected in series on a string, the cell current magnitude operating limit is also enforced on the string current. Different upper limits for the current magnitude may be set for charging and for discharging of the ESS.

Moreover, as an important indicator of battery operating status and circuit faults, the battery unit terminal voltage, e.g. battery cell terminal voltage, is also preferably constrained.

Optionally, the step of computing the state-of-power of the ESS comprises solving a constrained optimization problem, in which a possible load current magnitude and/or a possible load power magnitude for the ESS is/are maximised subject to the operating limits of the at least one constrained variable. In other words, the problem is solved my maximizing the possible load current magnitude and/or the possible load power magnitude for the ESS without violating the operating limits of the at least one constrained variable. The optimization problem may be solved in one shot without any intermediate preliminary estimates, or a step-by-step approach may be used. Solving the full optimization problem over an entire prediction time horizon in one shot is complicated, but not impossible, but a step-by-step approach may be more computationally efficient. As mentioned above, the determined SoP may comprise one or both of a charging SoP and a discharging SoP.

Optionally, the state-of-power is predicted for a predefinable prediction time horizon ($[t_0, t_0+\Delta t]$), and wherein the estimation comprises predicting an evolution of the at least one constrained variable during the prediction time horizon. This may be at least at two different time instants during the prediction time horizon, and preferably at several different time instants during the prediction time horizon.

Optionally, a maximum possible load current magnitude and/or a maximum possible load power magnitude for the ESS is/are set to be constant over the prediction time horizon.

Optionally, for each individual battery unit, a battery unit load power or load current is allowed to vary over time during the prediction time horizon. This is a different approach in comparison with conventional approaches using cell-level estimations of SoP as a basis for predicting the SoP of the ESS. In such conventional approaches, the SoP of the ESS is calculated under the assumption that each battery unit's power and/or current should remain constant over the prediction time horizon.

Optionally, the state-of-power is predicted for a predefinable prediction time horizon over which a maximum possible load current magnitude and/or a maximum possible load power magnitude for the ESS is set to be constant, while for each individual battery unit, the battery unit power or current is allowed to vary over time during the prediction time horizon, wherein the estimation comprises predicting the evolution of the at least one constrained variable during the prediction time horizon.

Optionally, the estimation of the state-of-power comprises:

- predicting the maximum possible load current magnitude and/or the maximum possible load power magnitude for the ESS over the prediction time horizon, which maximum possible load current magnitude and/or maximum possible load power magnitude is/are the load current and/or the load power of maximum magnitude that may be used without violating the operating limits of the at least one constrained variable, and
- setting the state-of-power of the ESS to the predicted maximum possible load current magnitude and/or the predicted maximum possible load power magnitude.

As mentioned above, the determined SoP may comprise one or both of a charging SoP and a discharging SoP.

Predicting the maximum possible charging or discharging current or power magnitude may comprise:

- predicting end values of the possible load current magnitude and/or the possible load power magnitude of the ESS at a beginning and an end of the prediction time horizon,
- based on the predicted end values, setting a preliminary estimate of the maximum possible load current magnitude and/or the maximum possible load power magnitude,
- determining whether the preliminary estimate is feasible, wherein, if the preliminary estimate is determined to be feasible, the preliminary estimate is set as the predicted maximum possible load current magnitude and/or the predicted maximum possible load power magnitude.

This step-by-step approach allows saving computational power in case the preliminary estimate is determined to be feasible. The preliminary estimate set based on the predicted end values may be set to the predicted minimum end value. Basically, in this step-by-step approach, the SoP for charging and/or discharging, respectively, is/are calculated based on each constrained variable separately at both end points of the prediction time horizon, and the minimum of these SoP values is used to compute preliminary SoP estimates for charging and/or discharging, respectively.

The operational limits of the constrained variables over the prediction time horizon might be hit at the beginning, at the end, or in between these time boundaries. In the step-by-step approach described above, it is first assumed that the operational limits are hit at boundaries, i.e. end points, of the prediction time horizon. Under this assumption, the SoP is calculated based on each constrained variable separately at both end points. Thereafter, the minimum of these calculated SoP values is taken to compute one or two preliminary SoP estimates, namely one for charging and/or one for discharging. Only if the aforementioned assumption is not true i.e., if the operational limits are not hit at the boundaries, a further search for an estimate is performed. In other words, further search and optimization are only performed if the operational limits are hit in-between two boundaries of the prediction time horizon.

Determining whether the preliminary estimate is feasible or not thus comprises determining whether the operational limits are hit at the end points of the prediction time horizon, or not. The preliminary estimate might turn out to be infeasible, because all intermediate values of the constrained values, i.e. between the beginning and the end of the prediction time horizon, are ignored, i.e., not checked against their limits, which means there is no guarantee that limits on these constrained variables are respected at each intermediate time instant. Thus, the feasibility of the preliminary ESS SoP estimate may be checked by feeding it to the system-level model of the ESS and simulating how various constrained variables of each individual battery unit evolve over the prediction time horizon when the ESS is loaded with a current or power corresponding to the preliminary SoP estimate. If this model-based simulation/prediction shows that any one of the operational limits is violated at any time instant between the end-points of the prediction time horizon, then the preliminary estimate may be determined to be infeasible and a further search is necessary. In case of no violation, the preliminary estimate may be considered as feasible, thus no further search will be needed and this preliminary estimate will be output as a final optimal value, i.e. it is output as the predicted state-of-power of the ESS.

If the preliminary estimate is not determined to be feasible, predicting the maximum possible charging or discharging current or power magnitude may further comprise:

solving an optimization problem to determine the maximum possible load current magnitude and/or the maximum possible load power magnitude of the ESS during the prediction time horizon.

This requires more computational power, but leads to a more accurate estimate in case the preliminary estimate is not determined to be feasible. The optimization problem is solved to find a feasible maximum load current magnitude and/or a feasible maximum load power magnitude for the ESS by removing any violation(s) of constrained variables that may occur between two end points of the prediction time horizon. This may be achieved by the following steps:

1) using model-based simulation, identifying a set of constrained variables whose operating limits are violated;
2) assuming that each constrained variable from the set achieves a peak, or valley, and hits its operating limit (so-called incidence point) at least once between the two end points of the prediction time horizon;
3) finding the points in time at which each constrained variable achieves its peak or valley (time of incidence) by using the above assumption in the system-level model, and then solving for time for each constrained variable in the set;
4) determining the magnitude of the ESS load current by plugging in the corresponding time of incidence in the system-level model for each constrained variable in the set;
5) determining the SoP of the ESS by taking the minimum of all the ESS load current magnitudes computed in step 4.

Optionally, an updating frequency of the estimation of the state-of-power of the ESS is at least 1 Hz, or 5 Hz, or 10 Hz, and wherein the prediction time horizon is set to at least 1 s, or 2 s, or 5 s, or 10 s, or 30 s. A typical update frequency may be 10 Hz. In some applications lower update frequencies are acceptable, and in some applications higher frequencies are desirable. The minimum update frequency depends on application and battery chemistry type. In some less dynamic applications, frequencies of less than 1 Hz may be sufficient. Furthermore, depending on application, longer prediction time horizons may be set, such as 1 minute to 60 minutes.

According to a second aspect of the invention, a method for controlling loading of an ESS comprising at least two battery units electrically connected in parallel is provided. The method comprises:

- predicting a state-of-power of the ESS using the method of the first aspect,
- based on the predicted state-of-power of the ESS, determining a planned load current and/or load power to be used for loading of the ESS;
- controlling loading of the ESS based on the determined planned load current and/or load power.

An improved control of the loading of the ESS, i.e. the charging and/or discharging current or power of the ESS, is achieved thanks to the more accurate prediction of the SoP provided using the system-level model of the ESS.

According to a third aspect, a control unit of an electric energy storage system comprising at least two battery units electrically connected in parallel is provided, wherein the control unit is configured to execute the steps of the method according to the first and/or second aspect.

According to a fourth aspect, a computer program comprising instructions to cause a computer to execute the steps of the method according to the first aspect is provided.

According to a fifth aspect, a computer readable medium having stored thereon the computer program according to the fourth aspect is provided.

According to a sixth aspect, an electric energy storage system comprising at least two battery units electrically connected in parallel and a control unit according to the third aspect is provided. The at least two battery units may comprise at least two battery modules electrically connected in parallel, each battery module comprising a plurality of battery cells. The ESS may be an ESS of a vehicle or vessel, but it may also be a stationary ESS, such as of a smart grid or back-up power supply system.

According to a seventh aspect, a vehicle comprising an electric energy storage system according to the sixth aspect is provided. The vehicle may be a fully electric vehicle, or a hybrid vehicle comprising also an internal combustion engine. The vehicle may preferably be a heavy duty vehicle such as a truck or a bus.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

The drawings are schematic and not necessarily drawn to scale.

DETAILED DESCRIPTION OF EXAMPLE EMBODIMENTS OF THE INVENTION

In the present detailed description, embodiments of the method according to the present invention are mainly described with reference to an all-electric bus, comprising a propulsion system in the form of battery powered electric motors. However, it should be noted that various embodiments of the described invention are equally applicable for a wide range of hybrid and electric vehicles.

Figure 1:
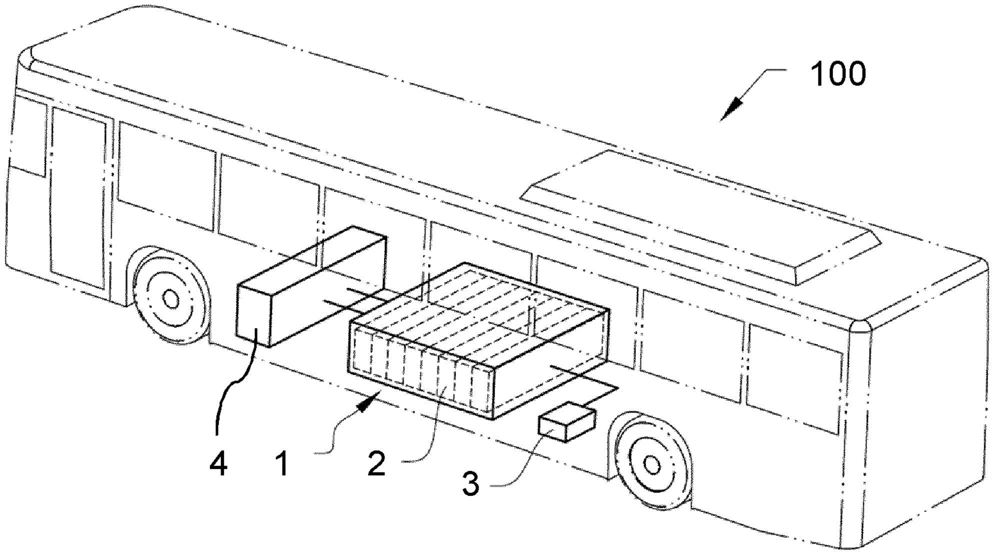
FIG. 1 shows a vehicle in which a method according to the invention may be implemented.

FIG. 1 shows a simplified perspective view of an all-electric vehicle in the form of a bus 100, which according to an embodiment is equipped with an electric propulsion unit 4 for propulsion of the bus. Of course, other loads may be provided in addition to or instead of the electric propulsion unit 4, for example auxiliary systems requiring electric power, and/or an on-board charger, and/or a power take-off.

The bus 100 carries an electric energy storage system (ESS) 1 comprising a plurality of parallel-connected battery units in the form of battery modules 2, each battery module 2 comprising a plurality of battery cells (not shown). The battery cells are connected in series to provide an output DC voltage having a desired voltage level. Suitably, the battery cells are of lithium-ion type, but other types may also be used. The number of battery cells per battery module 2 may be in the range of 50 to 500 cells, or even more, such as up to 10,000 cells. It is to be noted that the ESS may also include a plurality of battery packs, each comprising one or more battery modules 2. The battery packs may be connected in parallel.

Sensor units (not shown) may be arranged for collecting measurement data relating to operating conditions of the ESS, i.e. measuring temperature, voltage and current level of the battery cells. Measurement data from each sensor unit is transmitted to an associated ESS control unit 3, which is configured for managing the ESS 1 during operation of the bus 100. The ESS control unit 3 can also be configured for determining parameters indicating and controlling the condition or capacity of the ESS 1, such as the state-of-charge (SoC), the state-of-health (SoH), the state-of-power (SoP), the state-of-capacity (SoQ), the state-of-resistance (SoR) and the state-of-energy (SoE) of the battery pack 1. A single control unit 3 is shown, which may be e.g. a so-called Domain Control Unit, DCU, configured to implement complete control functionality on all levels of the ESS. However, it is to be understood that the ESS may instead be provided with multiple control units. For example, the ESS may be provided with battery management units, BMUs (not shown), for managing individual battery units, such as battery packs and/or battery modules, of the ESS 1. The BMU of each battery unit then receives and processes measurement data corresponding to its associated battery unit and also estimates state-of-capacity SoQ(i), SoR(i), SoH(i), and SoC(i). Each BMU then sends this data to the ESS control unit. It is possible to have either a dedicated ESS Master Control Unit or to select one of the BMUs and let it function as an ESS master control unit in addition to its battery unit level functionality.

The ESS control unit 3 may include a microprocessor, a microcontroller, a programmable digital signal processor or another programmable device. Thus, the ESS control unit 3 comprises electronic circuits and connections (not shown) as well as processing circuitry (not shown) such that the ESS control unit 3 can communicate with different parts of the bus 100 or with different control units of the bus 100. The ESS control unit 3 may comprise modules in either hardware or software, or partially in hardware or software, and communicate using known transmission buses such a CAN-bus and/or wireless communication capabilities. The processing circuitry may be a general purpose processor or a specific processor. The ESS control unit 3 comprises a non-transitory memory for storing computer program code and data. Thus, the skilled person realizes that the ESS control unit 3 may be embodied by many different constructions. This is also applicable to other control units of the ESS 1.

Figure 2:
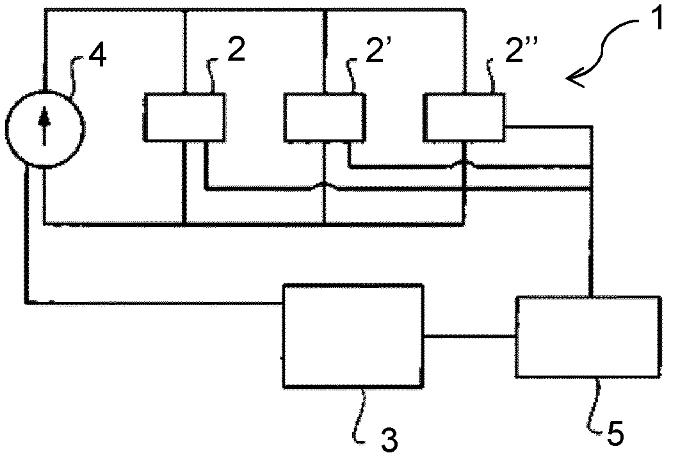
FIG. 2 is an example embodiment of an electric energy storage system according to the invention.

FIG. 2 shows an ESS 1 including three battery units 2, 2', 2" in the form of battery packs. The battery units 2, 2', 2" are electrically connected in parallel with a load 4 in the form of an electric propulsion unit, e.g. an electric motor/generator, a charger, or an auxiliary load. A control unit 3 as described above is connected to control, directly or indirectly, the load 4, as well as to control each battery unit 2, 2', 2". Load current or load power that the load 4 uses for loading of the ESS 1 may thereby be controlled. A measurement unit 5 is provided for collecting measurement data relating to operating conditions of each one of the battery units 2, 2', 2". For simplicity, the measurement unit 5 is shown as a single unit but it may of course be provided as a plurality of separate measurement units, e.g. one per battery unit 2, 2', 2", and it may comprise, or be configured to communicate with, a plurality of sensors.

Figure 3:
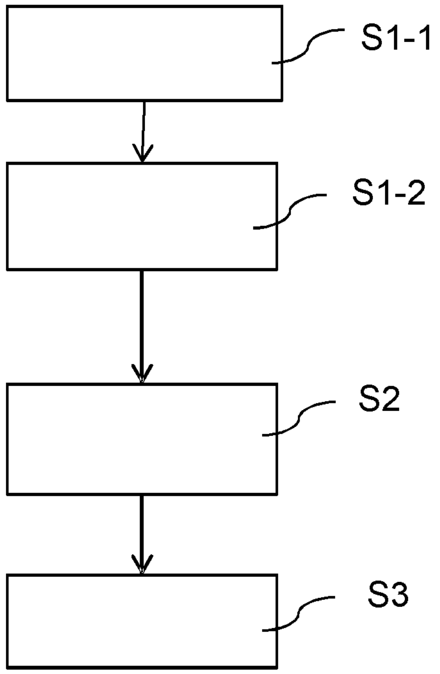
FIG. 3 is a flow-chart illustrating a method according to an embodiment of the invention.

A method for predicting a state-of-power, SoP, of an ESS 1 such as the one illustrated in FIG. 2 according to an embodiment of the invention is schematically illustrated in FIG. 3. The steps are carried out repeatedly, such as at a certain time interval, but may not necessarily be carried out in the order shown in FIG. 2. The method steps may in this embodiment be carried out in the ESS control unit 3.

In a first step S1-1, operational data are obtained from the battery units 2, 2', 2" of the ESS 1 are obtained during operation of the ESS 1. This operational data may comprise terminal current, terminal voltage, state-of-charge, temperature, state-of-capacity, and state-of-resistance, of each battery unit 2, 2', 2", at the present time instant. The operational data may be measurement data, and/or operational data derived from measurement data.

Figure 4:
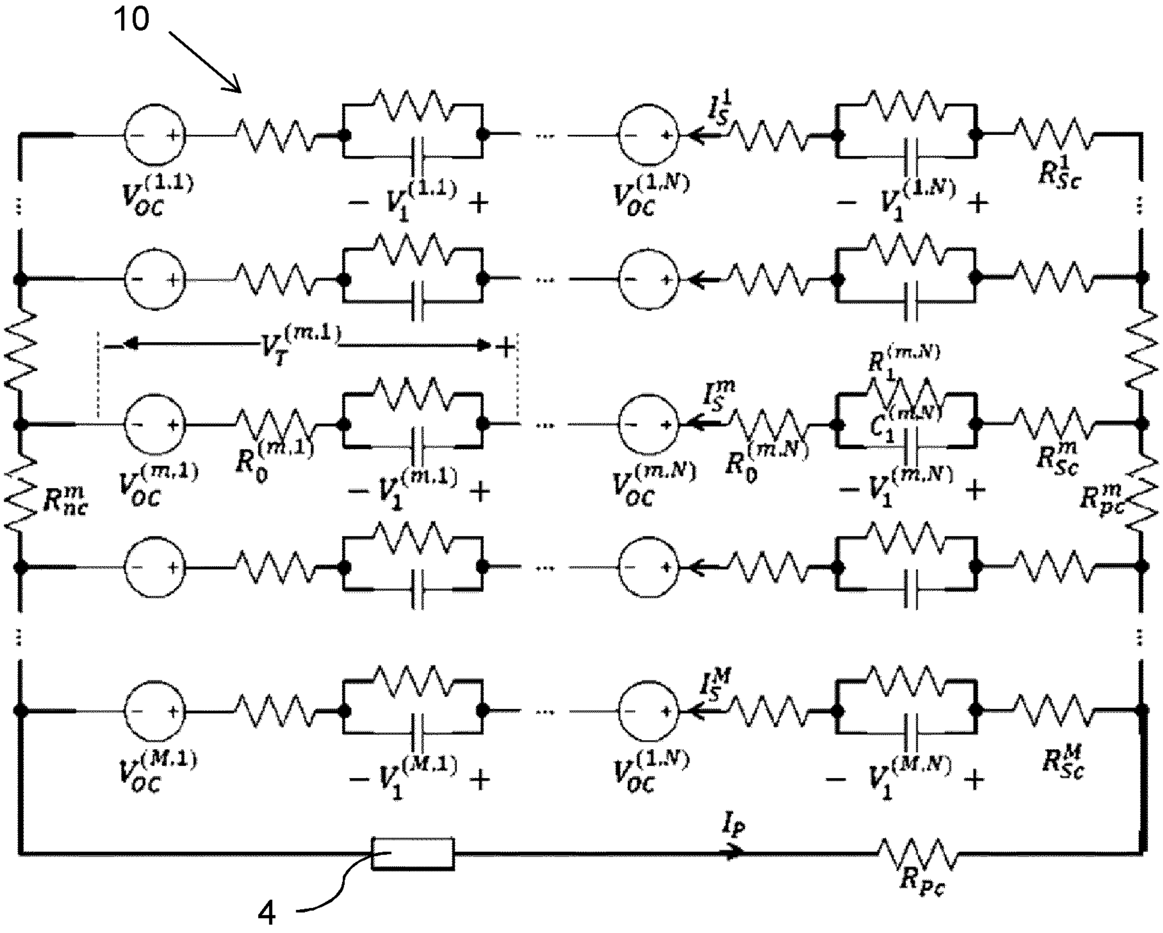
FIG. 4 is an example of a system-level equivalent circuit model of an ESS that may be used in a method according to the invention.

In a second step S1-2, the state-of-power, SoP, of the ESS 1 is computed based on the obtained operational data and by using an algorithm based on a system-level model of the ESS 1, wherein the system-level model is a dynamic mathematical model of the ESS 1 which is herein based on an equivalent electrical circuit model 10 as shown in FIG. 4. The system-level model of the ESS 1 takes into account on one hand each one of the battery units 2, 2', 2" of the ESS 1, and on the other hand at least one electrical connection between the at least two battery units. It further takes into account a dynamic parallel current distribution between the battery units 2, 2', 2", i.e., it is capable of making dynamic predictions of current distribution between the battery units 2, 2', 2". For instance, the model is adapted to predict different load distribution among the battery units 2, 2', 2" at several future time instants. The SoP of the ESS 1 is determined without intermediate estimation of the SoP of the individual battery units 2, 2', 2". The system-level model enables prediction of how load power distribution, during transient as well as at steady-state conditions, will take place in this ESS 1 when loaded by the load 4 as shown in FIG. 2.

In some embodiments, the invention relates to a method for controlling loading of the ESS 1 based on the predicted SoP. In this case, the method may further comprise the steps of:

S2: Based on the predicted SoP of the ESS 1, determining a planned load current or load power to be used for loading, either for charging or discharging, of the ESS 1; and S3: Controlling loading, i.e. charging or discharging, of the ESS 1 based on the determined planned load current or load power.

An exemplary embodiment of a system-level model that may be used to determine the SoP of an ESS 1 comprising a single battery pack including a plurality of battery modules connected in parallel will now be described in greater detail with reference to FIG. 4, which shows an equivalent circuit model (ECM) diagram 10 of such a battery pack comprising M parallel strings, battery strings, with N battery cells in series per string. The parallel-connected battery strings thus constitute parallel-connected battery units. To analyse, evaluate, and control the battery pack operation, the system needs to be appropriately modelled, including both individual battery cells and their connection topology. The battery ECM is deployed here to model each battery cell, and all wires connecting battery cells are characterized by resistors. In the following, the term "battery pack" may be understood as an ESS, and terms such as "pack current" and "pack voltage" may thus be understood as ESS current and ESS voltage, respectively.

As illustrated in FIG. 4, each battery cell ECM is composed of one voltage source representing its open circuit voltage (OCV), $$V_{OC}^{(m,n)},\ m \in \{1, 2, \ldots, M\},\ n \in \{1, 2, \ldots, N\},$$

one resistor characterizing its internal ohmic resistance, $$R_0^{(m,n)},$$

and at least one parallel-connected RC pair to capture the dynamics of internal voltage loss, polarization. In each RC pair, the resistance and capacitance are denoted by $$R_j^{(m,n)} \text{ and } C_j^{(m,n)},$$

respectively, and the corresponding RC pair's voltage is denoted by $$V_j^{(m,n)},\ j = 1, 2, \ldots, J,$$

where J denotes the order of the battery cell ECM. Here, only first-order ECM is shown for clear illustration, i.e., J=1. Based on FIG. 4, each cell's terminal voltage is:

$$V_T^{(m,n)} = V_{OC}^{(m,n)} + I_S^m R_0^{(m,n)} + \sum\nolimits_{j=1}^{J} V_j^{(m,n)},$$
$$m \in \{1, 2, \ldots, M\},\ n \in \{1, 2, \ldots, N\},$$

where $$I_S^m$$

denotes the current of all cells on the m:th string, i.e. the so-called string current.

To model the wiring among battery cells and a charger/load 4, connection resistors are added in FIG. 4. Specifically, all cell connection resistances on each string are aggregated into a connection resistance denoted by $$R_{Sc}^{(m)},\ m \in \{1, 2, \ldots, M\}.$$

Besides, between adjacent parallel strings, the connection resistance on the positive and negative terminals are denoted by $$R_{pc}^m \text{ and } R_{nc}^m,$$

respectively. In addition, the charger/load 4 is connected to the battery pack through a wire with its total resistance denoted by $R_{Pc}$.

Based on the ECM, a state-space representation of serial cells on all strings may be generalized. First, for each battery cell, the OCV and the RC pair voltage are chosen as state variables and the system state vector x is defined by $$x = \left[V_{OC}^{(1,1)}, V_1^{(1,1)}, \ldots, V_J^{(1,1)}, V_{OC}^{(1,2)}, V_J^{(1,2)}, \ldots, V_{OC}^{(M,N)}, V_1^{(M,N)}, \ldots, V_J^{(M,N)}\right]^T,$$
$$x \in \mathbb{R}^{(J+1)MN}.$$

The state-space representation of all battery cells can be generalized as $$\dot{x} = A_S x + B_S I_S,$$

wherein $A_S$ and $B_S$ are matrices whose elements are defined in terms of aforementioned known ECM parameters and $I_S$ is the string current vector.

Due to the dynamic current distribution among parallel battery strings, all string currents are interdependent on each other and are difficult to assign. Usually, it is the pack current $I_P$ of the entire battery pack, including multiple parallel-connected battery units, that is possible to control, which requires analysis of the relation between the string currents and the pack current, e.g. by applying Kirchhoff's voltage law to each loop composed of two adjacent battery strings and their connection resistors. It may thereby be possible to represent the string currents $I_S$ by the pack current $I_P$ as $$I_S = C_S x + D_S I_P,$$

wherein $C_S$ and $D_S$ are matrices whose elements are defined in terms of aforementioned known ECM parameters. It can be seen that a constant pack current $I_P$ leads to time-varying string and cell currents $I_S$ since the system state vector x is involved.

The state-space representation of the battery pack including parallel-connected battery units, and thereby of the ESS, using the pack current $I_P$ as input instead of string current Is, may be formulated as $$\dot{x} = Ax + BI_P,$$

wherein A is a matrix dependent on the matrix $A_S$ and wherein B is a matrix dependent on the matrix $B_S$. The values of both matrices A and B are state-dependent due to the battery cell OCV-SoC curve, so that the state-space representation of the battery pack is a non-linear system or a time-varying linear system.

In addition, as important variables constrained in predicting the battery pack SoP, the vector of cell terminal voltages, denoted by $$V_T = \left[V_T^{(1,1)}, V_T^{(1,2)}, \ldots, V_T^{(M,N)}\right]^T,$$

-continued $$V_T \in \mathbb{R}^{MN},$$

can be derived from the above and viewed as another possible output of the state-space representation of the battery pack:

$$V_T = C_T x + D_T I_P,$$

wherein $C_T$ and $D_T$ are so-called output and feedthrough matrices, respectively, when using cell terminal voltages as outputs.

To maintain the safe operation of a multi-battery ESS, herein represented by the battery pack, each battery cell/battery unit within the battery pack needs to operate within certain constraints commonly imposed on constrained variables of each battery cell/unit, the constrained variables including battery unit current, battery unit terminal voltage, battery unit temperature, battery unit state-of-charge, and/or battery unit open circuit voltage. In other words, operating limits are imposed on those constrained variables of the battery units.

In the following, ESS/battery pack SoPs considering various constraints will be studied based on the state-space representation of ESS/battery pack operation formulated above. For multi-battery ESSs comprising cell/module connection structures other than the one shown in FIG. 4, the proposed pack SoP estimation procedure is also applicable since the formulation of state-space representation and the following analysis are both presented in generic forms.

Computing the SoP of the ESS typically comprises solving a constrained optimization problem, in which a possible load current magnitude and/or a possible load power magnitude for the ESS is/are maximised subject to the operating limits of the at least one constrained variable. In other words, the problem is solved by maximizing the possible load current magnitude and/or the possible load power magnitude for the ESS without violating the operating limits of the at least one constrained variable. This type of optimization problem may mathematically be expressed as:

$$\max|I_P(t)|\forall\, t \in [t_0, t_0 + \Delta t],\ \forall\, i \in \{1, \ldots, M\}, \text{ and } \forall\, j \in \{1, \ldots, N\}$$

$$\text{subject to}$$

$$\dot{x}(t) = Ax(t) + BI_P(t),$$

$$y(t) = Cx(t) + DI_P(t),$$

$$\left|I_S^i(t_0 : t_0 + \Delta t)\right| \le I_{S,max}^i,$$

$$SoC_{min}^{(i,j)} \le SoC^{(i,j)}(t : t + t_h) \le SoC_{max}^{(i,j)},$$

$$V_{T,min}^{(i,j)} \le V_T^{(i,j)}(t_0 : t_0 + \Delta t) \le V_{T,max}^{(i,j)}, \text{ and}$$

$$T_{min}^{(i,j)} \le T^{(i,j)}(t_0 : t_0 + \Delta t) \le T_{max}^{(i,j)},$$

i.e. wherein constraints apply to each string current $$I_S^i,$$

state-of-charge $SoC^{(i,j)}$, terminal voltage $$V_T^{(i,j)},$$

and temperature $T^{(i,j)}$ of each cell at position (i,j) in the battery pack, respectively. A, B, C, D are matrices as explained above.

Denote the present time instant by to, and consider a prediction horizon $[t_0; t_0+\Delta t]$ for the SoP prediction. Then, during this prediction horizon, as long as the battery pack current is bounded by the pack SoP, none of the operating constraints considered would be violated. Note that, the multi-battery ESS/battery pack SoP needs to be updated frequently to adapt to the time varying system states and parameter values, e.g., an updating frequency of 10 Hz is typically applied to the battery pack SoP estimation in EVs. Denote the update period of pack SoP estimation by $\Delta t_u$, $\Delta t_u \le \Delta t$. Then, each battery pack SoP estimated at to for the following prediction time horizon $\Delta t$ is valid until $t_0+\Delta t_u$.

During a sufficiently short prediction time horizon $\Delta t$, the battery cell's OCV-SoC slope can be approximately viewed as constant. Alternatively, it is possible to use a so-called piecewise affine approximation of the battery cell's OCV-SoC slope to handle longer prediction time horizons.

Moreover, while the model parameters in FIG. 4 are influenced by factors such as the cell current, SoC, temperature, and hysteresis, these factors do not change substantially given a constant pack current during a short prediction time horizon. The multi-battery ESS/battery pack SoP is defined by a constant pack current, and, thus, within a short prediction time horizon these model parameter values are assumed constant. As a result, during a single short prediction time horizon, the system matrices A, B can be approximately regarded as constant, and the battery pack state-space representation becomes a linear time invariant (LTI) system. In the case when the system behaviour over multiple prediction time horizons is considered, the battery pack's state-space representation will instead be a time-varying linear system.

To allow for various operating constraints, the LTI system output is expressed in a generic form:

$$y(t) = Cx(t) + DI_P.$$

For instance, if it is desired to output the string current $I_S$, C may be set to $C_S$ and D may be set to $D_S$ based on the above in order to find the time-domain solutions x(t) and y(t) during the prediction time horizon.

If a battery pack current $$I_P^{SoP}$$

corresponding to the battery pack SoP is fed to the linear state-space system model, i.e. to the LTI system, at least a q*-th output entry out of a total of Q entries, such as one of the string current output entries and/or one of the terminal voltage output entries, will reach an output limit $y^{lim}$ at some time instant t* during the prediction time horizon $[t_0; t_0+\Delta t]$, such that $y_{q*}(t^*)=y^{lim}$. To predict a feasible battery pack/ESS SoP, both the particular output entry/ies q* hitting the limit and the time instant t* at which it/they hit/s the limit need to be identified.

If the q-th output entry $y_q$ reaches its limit $y^{lim}$ at the time instant $t \in [t_0, t_0+\Delta t]$, then $y_q(t)=y^{lim}$. The corresponding battery pack current during the prediction time horizon is $$I_P^{SoP}(q, t) = \frac{y^{lim} - I_q C e^{A(t-t_0)} x(t_0)}{I_q(CK_A(t-t_0)B + D)},$$
$$q \in \{1, 2, \ldots, Q\},\ t \in [t_0, t_0 + \Delta t],$$

where $I_q$ is the q-th row of the identity matrix of size Q, and the matrices A, B, C, and D are either pre-calculated or updated at $t=t_0$. Given the output limit $y^{lim}$, the corresponding input battery pack current $$I_P^{SoP}$$

depends not only on the index of the requested output entry, but also on the time instant at which the limit is reached.

Different ESS/battery pack currents can be obtained depending on the specified output entry and its time of hitting the limit. To ensure safe operation of the multi-battery ESS, i.e. the battery pack, none of the entries in the output vector is allowed to exceed the limits throughout the prediction horizon. Thus, among all estimated possible battery pack load currents estimated, the load current of minimum magnitude is selected as the battery pack's SoP for charging and/or discharging, respectively:

$$|I_P^{SoP}| = |I_P^{SoP}(q^*, t^*)| = \min_{\substack{q \in \{1,2,\ldots,Q\},\\ t \in [t_0, t_0+\Delta t]}} |I_P^{SoP}(q, t)|.$$

In real applications, the exact battery pack SoP may be impossible to obtain by exhaustive search due to computational constraints. Therefore, a battery pack-model-based estimation algorithm, i.e. an algorithm based on the system-level model, using a multi-step approach, has been designed.

Figure 5:
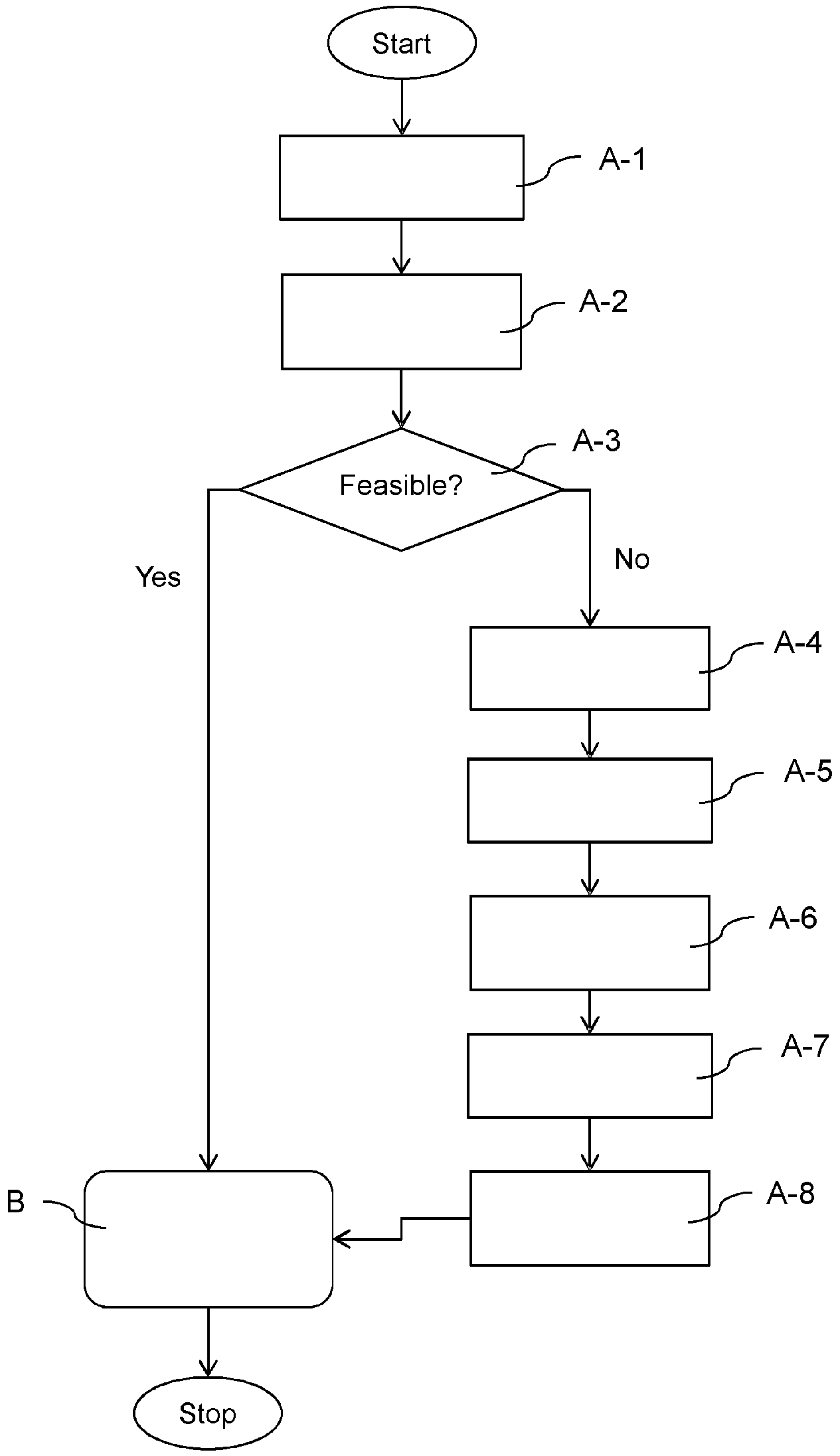
FIG. 5 is another flow-chart illustrating steps of a method according to an embodiment of the invention.

In short, an estimation algorithm for predicting the ESS SoP according to some embodiments of the invention is illustrated in a flow chart in FIG. 5. The estimation algorithm may comprise:

A: Predicting a maximum possible load current magnitude and/or a maximum possible load power magnitude for the ESS over the prediction time horizon, which maximum possible load current magnitude and/or a maximum possible load power magnitude is the load current and/or load power of maximum magnitude that may be used without violating the operating limits of the at least one constrained variable; and B: Setting the predicted SoP of the ESS to the predicted maximum possible load current magnitude and/or the predicted maximum possible load power magnitude.

The step A may be carried out by the following sub-steps:

A-1: Predicting end values of the possible load current or load power of the ESS at a beginning and an end of the prediction time horizon, using primarily the equation for determining $$I_P^{SoP}(q, t)$$

as defined above. It is in this case assumed that the maximum or minimum of the constrained variables over the prediction time horizon occurs at the beginning or end of the prediction time horizon, so that the end value may serve as an initial guess of the battery pack SoP.

A-2: Based on the predicted end values, setting a preliminary estimate of the maximum possible charging or discharging current or power, using the equation for determining $$|I_P^{SoP}|$$

as defined above. This preliminary estimate serves as an initial guess. Under the assumption made in step A-1, the SoP is calculated based on each constrained variable separately at both end points. Thereafter, the minimum of these calculated SoP values is taken to compute the preliminary SoP estimates, one for charging and the other for discharging. Only if the aforementioned assumption is not true i.e., if the operational limits are not hit at the boundaries, a further search for an estimate is performed. In other words, further search and optimization are only performed if the operational limits are hit in-between two boundaries of the prediction time horizon.

A-3: Determining whether the preliminary estimate is feasible. The preliminary estimate might be infeasible since all intermediate output values of the constrained values, i.e. between the beginning and end of the prediction time horizon, are ignored. Thus, the feasibility of the preliminary estimate still needs to be checked by feeding it to the state-space representation of the multi-battery ESS/battery pack and sampling the output values of the constrained variables through the output equations to find e.g. the cell terminal voltages VT and/or the string currents $I_S$. In this way, any violations of the operating limits of the constrained variables among the sampling points will be detected.

If the preliminary estimate is found to be feasible, i.e. if no output violates the operating limit(s) of the constrained variable(s), the algorithm proceeds to step B. In other words, the preliminary estimate is output as the predicted SoP of the ESS.

If instead outliers violating the operating limits are detected, the preliminary estimate is deemed not to be feasible, and the algorithm proceeds by solving an optimization problem. This may include the following sub-steps:

A-4: Using model-based simulation, identifying a set of constrained variables whose operating limits are violated. This may be one or more constrained variables.

A-5: Assuming that each constrained variable from the set achieves a peak, or valley, and hits its operating limit (so-called incidence point) at least once between the two end points of the prediction time horizon. By setting a short-term prediction time horizon, such as 1 s, it may be assumed that the cell current and the cell terminal voltage will not oscillate during the prediction time horizon, and that only one peak or valley per variable will be found.

A-6: Finding the points in time at which each constrained variable achieves its peak or valley (time of incidence) by using the above assumption in the system-level model, and then solving for time for each constrained variable in the set.

A-7: Determining the magnitude of the ESS current by plugging in the corresponding time of incidence in the system-level model for each constrained variable in the set.

A-8: Predicting the SoP of the ESS, i.e. the maximum possible load current magnitude or load power magnitude, by taking the minimum of all the ESS current magnitudes computed in step A-7. The algorithm thereafter proceeds to step B.

Upper and lower limits of the battery cell SoC, commonly imposed to avoid over-utilising any battery cell in the ESS, has to be treated slightly differently in the battery pack SoP estimation, since the evolution of the cell OCV-SoC curve's slope from present cell SoC to its specified limit needs to be involved. The proposed algorithm is derived for a short prediction time horizon during which the curve can be assumed constant. The battery cell-SoC limited battery pack SoP may preliminarily be estimated based on the SoP estimates for other operating limits, e.g., the cell current and terminal voltage operating limits, and then followed by a feasibility check. If any cell SoC exceeds the limit during the prediction time horizon, it already gets sufficiently close to the SoC limit at the beginning. Thus, the proposed method for removing the excess can still be applied. When checking the feasibility of the preliminary estimate and removing the excess if detected, relevant output matrices may be derived as follows.

To track the battery cell SoC evolution in a battery pack including parallel connections, as compared to Coloumb counting through the integral of a time-varying cell current, it is computationally more efficient to study the battery cell OCV alternatively since it can be directly extracted from the system state vector x. Denoting the battery cell OCV vector by $$V_{OC}=\left[V_{OC}^{(1,1)},\ V_{OC}^{(1,2)},\ \ldots\ ,\ V_{OC}^{(M,N)}\right]^{T},\ V_{OC}\in\mathbb{R}^{MN},$$

it may be expressed as the system output $$V_{OC}C_{OC}x+D_{OC}I_{P}.$$

By applying a generic linear battery pack model and derived analytical expressions, the proposed method and algorithm become more computationally efficient than by directly constructing a non-linear time-varying system model to which solutions can only be numerically searched.

It is to be understood that the present invention is not limited to the embodiments described above and illustrated in the drawings; rather, the skilled person will recognize that many changes and modifications may be made within the scope of the appended claims.

The invention claimed is:

1. A method for controlling loading of an energy storage system (ESS) comprising at least two battery units electrically connected in parallel, the method comprising:
- obtaining operational data from the at least two battery units of the ESS during operation of the ESS;
- computing a state-of-power of the ESS based on the obtained operational data and by using an algorithm based on a system-level model of the ESS, wherein the system-level model of the ESS takes into account on one hand each one of the at least two battery units of the ESS, and on the other hand at least one electrical connection between the at least two battery units, and wherein the system-level model of the ESS further takes into account a dynamic parallel load distribution between the at least two battery units,
- wherein operating limits of at least one constrained variable of each one of the at least two battery units are used as input to the system-level model, wherein the at least one constrained variable includes at least one of battery unit current, battery unit terminal voltage, battery unit temperature, battery unit state-of-charge, and battery unit open circuit voltage,
- wherein the step of computing the state-of-power of the ESS comprises solving a constrained optimization problem, in which a possible load current magnitude and/or a possible load power magnitude for the ESS is/are maximised subject to the operating limits of the at least one constrained variable,
- wherein the state-of-power is predicted for a predefinable prediction time horizon, and wherein the estimation comprises predicting an evolution of the at least one constrained variable during the prediction time horizon,
- wherein a maximum possible load current magnitude and/or a maximum possible load power magnitude for the ESS is/are set to be constant over the prediction time horizon, and wherein for each individual battery unit, a battery unit load power or load current is allowed to vary over time during the prediction time horizon.

2. The method according to claim 1, wherein the system-level model of the ESS is a dynamic mathematical model based on an equivalent circuit model in which the at least one electrical connection between the at least two battery units is modelled as at least one resistance.

3. The method according to claim 1, wherein the prediction of the state-of-power comprises:
- predicting the maximum possible load current magnitude and/or the maximum possible load power magnitude for the ESS over the prediction time horizon, which maximum possible load current magnitude and/or maximum possible load power magnitude is the load current and/or load power of maximum magnitude that may be used without violating the operating limits of the at least one constrained variable, and
- setting the state-of-power of the ESS to the predicted maximum possible load current magnitude and/or the maximum possible load power magnitude.

4. The method according to claim 3, wherein predicting the maximum possible load current magnitude and/or the maximum possible load power magnitude comprises:
- predicting end values of the possible load current magnitude and/or the possible load power magnitude of the ESS at a beginning and an end of the prediction time horizon,
- based on the predicted end values, setting a preliminary estimate of the maximum possible load current magnitude and/or the maximum possible load power magnitude,
- determining whether the preliminary estimate is feasible, wherein, if the preliminary estimate is determined to be feasible, the preliminary estimate is set as the predicted maximum possible load current magnitude and/or the predicted maximum possible load power magnitude.

5. The method according to claim 4, wherein, if the preliminary estimate is not determined to be feasible, the method further comprises:
- solving an optimization problem to determine the maximum possible load current magnitude and/or the maximum possible power magnitude of the ESS during the prediction time horizon.

6. The method according to claim 1, wherein an updating frequency of the estimation of the state-of-power of the ESS is at least 1 Hz, or 5 Hz, or 10 Hz, and wherein the prediction time horizon is set to at least 1 s, or 2 s, or 5 s, or 10 s, or 30 s.

7. A control unit of an electric energy storage system comprising at least two battery units electrically connected in parallel, wherein the control unit is configured to execute the steps of the method according to claim 1.

8. A non-transitory computer readable medium having stored thereon a computer program comprising instructions to cause a computer to execute:

obtaining operational data from at least two battery units of an energy storage system (ESS) during operation of the ESS;

computing a state-of-power of the ESS based on the obtained operational data and by using an algorithm based on a system-level model of the ESS, wherein the system-level model of the ESS takes into account on one hand each one of the at least two battery units of the ESS, and on the other hand at least one electrical connection between the at least two battery units, and wherein the system-level model of the ESS further takes into account a dynamic parallel load distribution between the at least two battery units, wherein operating limits of at least one constrained variable of each one of the at least two battery units are used as input to the system-level model, wherein the at least one constrained variable includes at least one of battery unit current, battery unit terminal voltage, battery unit temperature, battery unit state-of-charge, and battery unit open circuit voltage, wherein the step of computing the state-of-power of the ESS comprises solving a constrained optimization problem, in which a possible load current magnitude and/or a possible load power magnitude for the ESS is/are maximised subject to the operating limits of the at least one constrained variable, wherein the state-of-power is predicted for a predefinable prediction time horizon, and wherein the estimation comprises predicting an evolution of the at least one constrained variable during the prediction time horizon, wherein a maximum possible load current magnitude and/or a maximum possible load power magnitude for the ESS is/are set to be constant over the prediction time horizon, and wherein for each individual battery unit, a battery unit load power or load current is allowed to vary over time during the prediction time horizon.

9. A method for controlling loading of an electric energy storage system (ESS), the ESS comprising at least two battery units electrically connected in parallel, the method comprising:

obtaining operational data from the at least two battery units of the ESS during operation of the ESS;

computing a state-of-power of the ESS based on the obtained operational data and by using an algorithm based on a system-level model of the ESS, wherein the system-level model of the ESS takes into account each one of the at least two battery units of the ESS and at least one electrical connection between the at least two battery units, and wherein the system-level model of the ESS further takes into account a dynamic parallel load distribution between the at least two battery units;

based on the computed state-of-power of the ESS, determining a planned load current and/or load power to be used for loading of the ESS; and controlling loading of the ESS based on the determined planned load current and/or load power.

10. The method of claim 9 wherein the algorithm based on a system-level model of the ESS comprises:

an estimation algorithm.

11. The estimation algorithm of claim 10 comprising:

A: predicting a maximum possible load current magnitude and/or a maximum possible load power magnitude for the ESS over a prediction time horizon, which maximum possible load current magnitude and/or a maximum possible load power magnitude is the load current and/or load power of maximum magnitude that may be used without violating operating limits of at least one constrained variable; and B: setting a predicted state of power of the ESS to the predicted maximum possible load current magnitude and/or the predicted maximum possible load power magnitude.

12. The estimation algorithm of claim 11 further comprising:

A-1: predicting end values of the possible load current or load power of the ESS at a beginning and an end of the prediction time horizon; and A-2: based on the predicted end values, setting a preliminary estimate of the maximum possible charging or discharging current or power.

13. The estimation algorithm of claim 11 further comprising:

A-3: determining whether the preliminary estimate is feasible.

14. A non-transitory computer readable medium having stored thereon a computer program comprising instructions to cause a computer to execute the steps of the method according to claim 9.

15. A vehicle comprising an electric energy storage system (ESS) comprising the method of claim 9.

16. The vehicle of claim 15 comprising a truck or a bus.

* * * * *